(12) United States Patent
Law

(10) Patent No.: US 6,691,294 B2
(45) Date of Patent: Feb. 10, 2004

(54) METHOD AND DEVICE FOR IMPLEMENTING BY-PASS CAPACITORS

(75) Inventor: Ming Kin Law, Toronto (CA)

(73) Assignee: ATI Technologies, Inc., Thornhill (CA)

( * ) Notice: Subject to any disclaimer, the term of this patent is extended or adjusted under 35 U.S.C. 154(b) by 0 days.

(21) Appl. No.: 10/055,835

(22) Filed: Jan. 23, 2002

(65) Prior Publication Data

US 2003/0140322 A1 Jul. 24, 2003

(51) Int. Cl.[7] ............................................... G06F 17/50
(52) U.S. Cl. ............................. 716/11; 716/2; 716/14; 716/16; 257/532
(58) Field of Search ...................... 716/1–21

(56) References Cited

U.S. PATENT DOCUMENTS

| | | | | |
|---|---|---|---|---|
| 5,023,476 A | * | 6/1991 | Watanabe et al. | 327/540 |
| 5,589,719 A | * | 12/1996 | Fiset | 307/131 |
| 5,631,492 A | * | 5/1997 | Ramus et al. | 257/532 |
| 5,963,471 A | * | 10/1999 | Ohata et al. | 365/174 |
| 5,998,846 A | * | 12/1999 | Jan et al. | 257/401 |

OTHER PUBLICATIONS

Lee et al., "Simultaneously formed storage node contact and metal contact cell (SSMC) for 1 Gb DRAM and beyond" Electron Devices Meeting, 1996., International, Dec. 8–11, 1996.*

Weis et al., A highly cost efficient 8F2 DRAM cell with a double gate vertical transistor device for 100 nm and beyond Electron Devices Meeting, 2001. IEDM Technical Digest. International, Dec. 2–5, 2001 pp. 18.7.1–18.7.4.*

* cited by examiner

Primary Examiner—Matthew Smith
Assistant Examiner—Andrea Liu

(57) ABSTRACT

An unused logic portion of a device is identified, where the unused logic portion of the device is part of a metal definable logic portion of the device. The unused logic portion is specified to be used as a bypass capacitor between a first and second power node.

18 Claims, 14 Drawing Sheets

METHOD AND DEVICE FOR IMPLEMENTING BY-PASS CAPACITORS

FIELD OF THE DISCLOSURE

The present invention relates generally to controlling ground bounce in semiconductor devices.

BACKGROUND

Ground bounce is known to occur in integrated circuits and to cause signal distortion and increased gate delays. Problems associated with ground bounce, or other power rail noise, become more pronounces as trace sizes are reduced for deep submicron technologies. The use of de-coupling capacitors has been proposed to address the problem of integrated circuit ground bounce. Discrete decoupling capacitors, which are external to an integrated circuit device, may not adequately resolve ground bounce introduced on an integrated circuit if the ground bounce is generated because of switching on the integrated device. Integrated decoupling capacitors, formed on the integrated circuit device, can be used to stop such internally generated ground bounce, but such internal capacitors can occupy significant die area.

Therefore, a method and or apparatus for controlling ground bounce that overcomes the problems of the prior art would be useful.

DETAILED DESCRIPTION OF THE FIGURES

In accordance with the present disclosure a base device has dummy logic portions that have metal definable functions. As such, the dummy logic portions can accommodate implementation of future logic changes, or fixes, by defining and implementing different metal mask layers. An unused logic portion of the base device is identified specified for use as a by-pass capacitor. The connectivity of the unused logic portion is defined by one or more metal layers to create a by-pass capacitor between first and second power supply nodes by using logic gates.

Known problems of ground bounce are addressed by having metal definable logic transistors implement by-pass capacitors dummy logic portions of the device, while maintaining the flexibility of allowing subsequent functionality changes to the base device by using differently defined metal layers. By implementing unused logic portions as by-pass capacitors, greater flexibility is achieved over the use of previous methods which integrated dedicated by-pass capacitor cells onto the base device, thereby obtaining greater flexibility than other methods which use discrete by-pass capacitors. Specific embodiments of the present disclosure are described in FIGS. 1–14.

Figure 1:
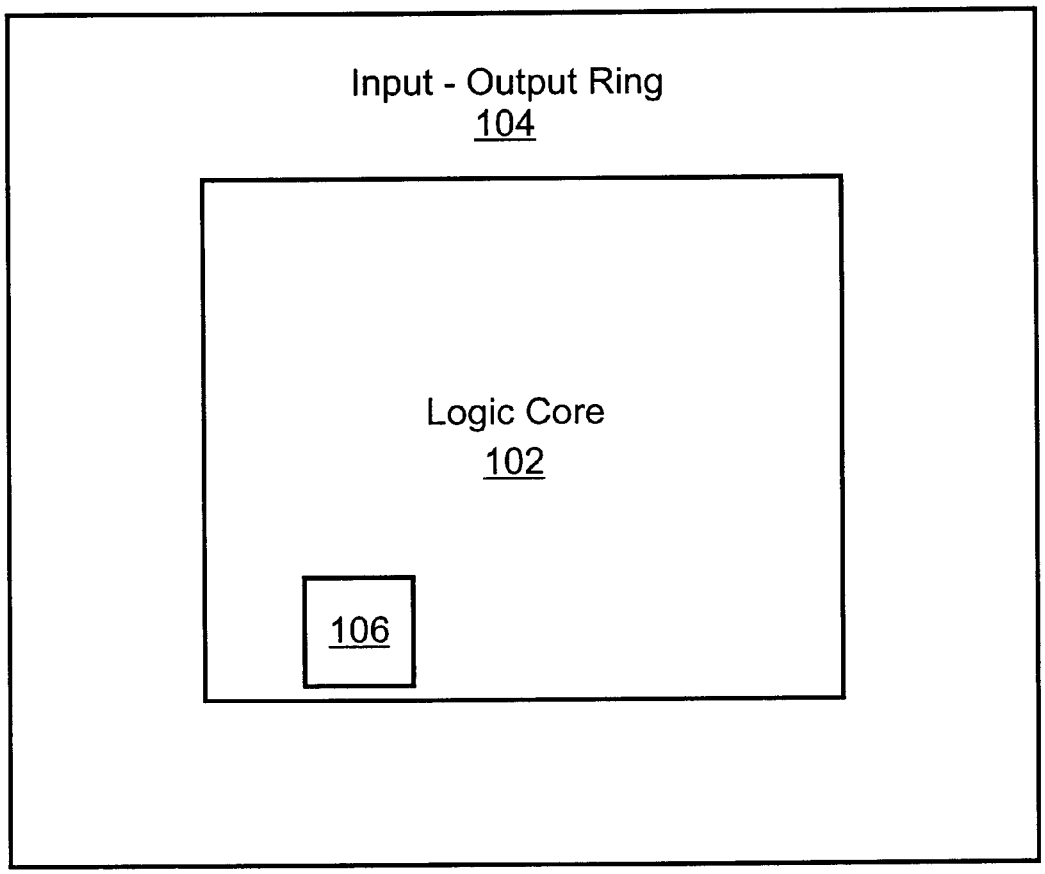
FIG. 1 illustrates a floor plan for an integrated circuit device in accordance with the present invention.

FIG. 1 illustrates an integrated circuit device 100 having a logic core 102 and an input-output (I-O) ring 104. In operation, the I-O ring 104 interfaces with external devices (not shown) to transmit and receive signals to and from the logic core 102. The logic core 102 contains logic circuits that implement specific functionality. In various embodiments, the device 100 can be used to implement an application specific device, or a general purpose device. Examples of application specific devices can include a graphics chip, memory controller, networking component, or any other device specified by a user to implement a specific function. Examples of general purpose devices include microprocessors, microcontrollers, and other devices not targeted to specific applications. General purpose devices are generally software controlled by end users.

The device 100 represents a base device, or base die, that is defined up to the metal layers. The base device includes a plurality of dummy logic cells that do not have a predefined function. By having a base device with dummy cells, flexibility is gained by allowing for later changes by defining one or more metal layers to implement a function using the dummy cells. Specifically, as part of an initial design process, the logic core 102, also referred to as a base logic core, of device 100 has been designed to include dummy cells, including a dummy cell at location 106. The term dummy cell is used to refer to one or more transistors placed during layout that are not needed to perform a specific predefined function. Because the transistors are anticipated to be used to implement subsequent logic functions, they are logic transistors in that they are capable of interfacing with other logic devices. These dummy cells represent unused logic of the logic core 102.

Figure 2:
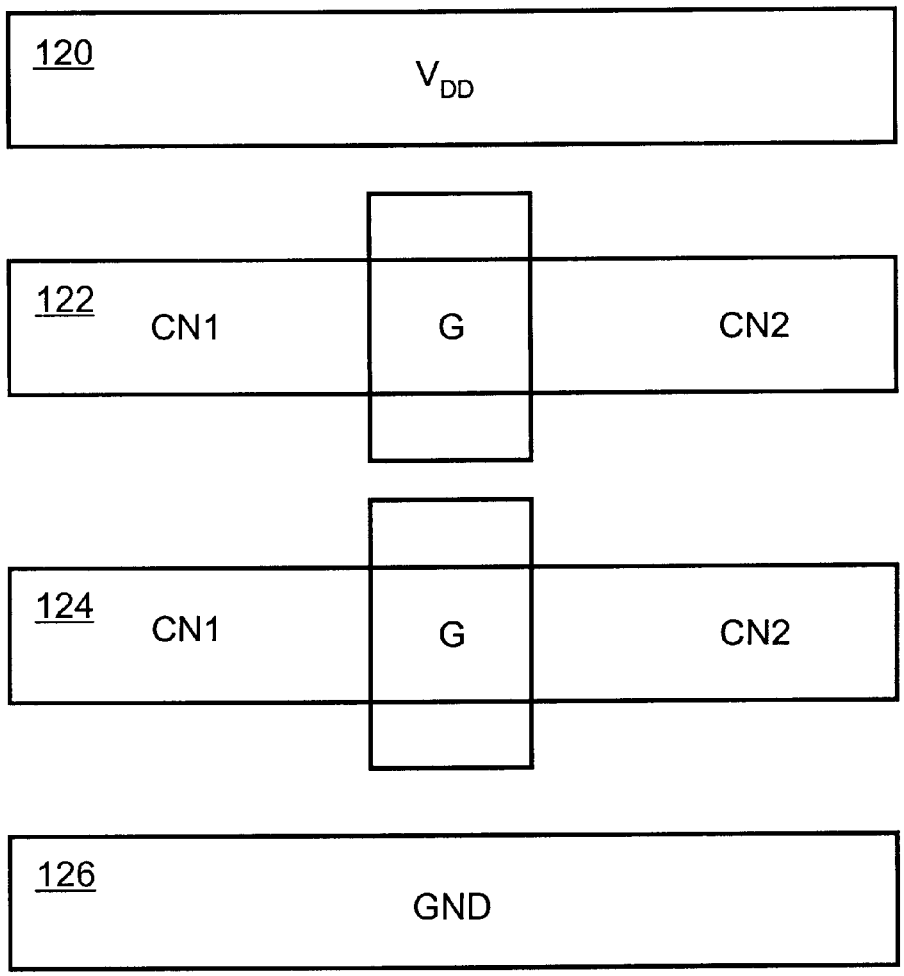
FIG. 2 illustrates a plan view for a layout of a dummy logic cell in accordance with the present invention.
Figure 3:
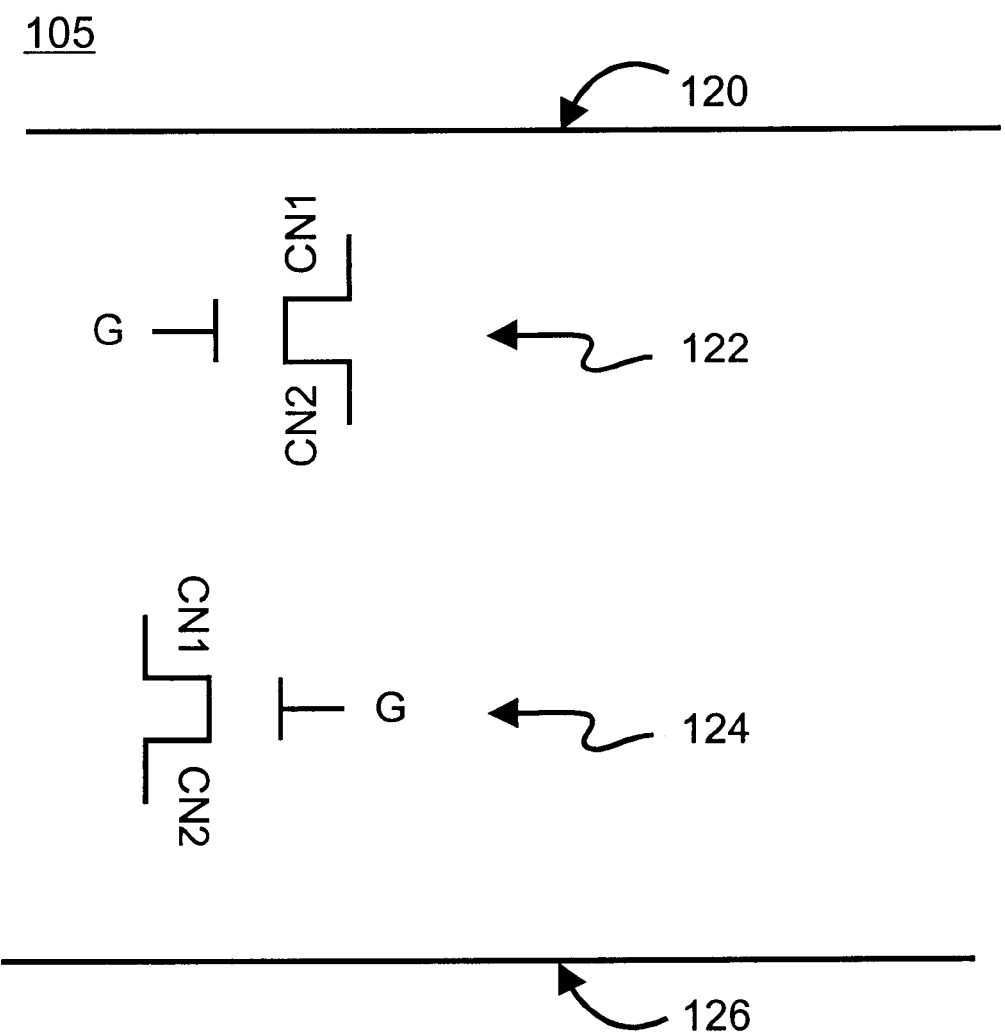
FIG. 3 illustrates a circuit representation of the dummy cell of FIG. 2.

FIG. 2 illustrates a plan view for a layout of a dummy cell 105, which may reside at location 106 of FIG. 1, having two transistors. The dummy cell 105 comprises Vdd power rail 120, ground (GND) rail 126, NMOS transistor 122, and PMOS transistor 124. Note that since the device 100 is a base die, the transistors 122 and 124 of the dummy cell 106 would not initially have a predefined functionality. FIG. 3 illustrates a circuit representation of the dummy cell 105. Note that the transistors 122 and 124 will be logic transistors, also referred to as logic gates.

Figure 4:
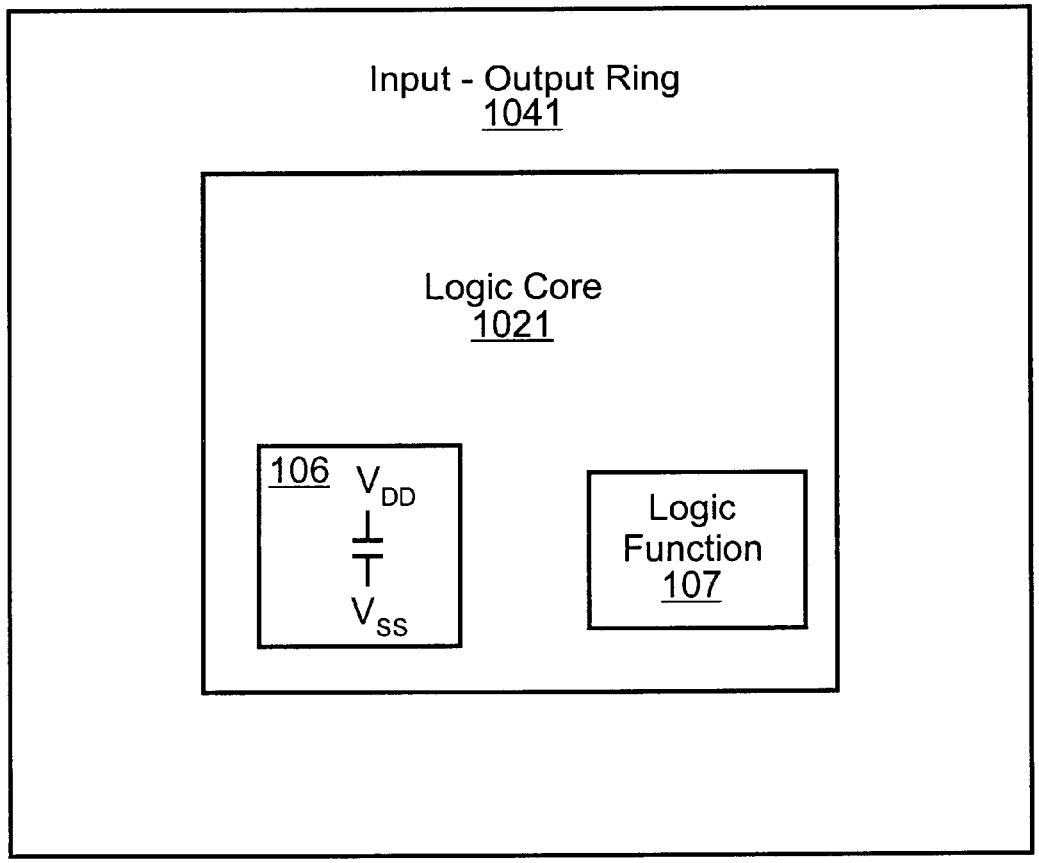
FIG. 4 illustrates combination floor plan and circuit view for an integrated circuit device in accordance with the present invention.

FIG. 4 illustrates device 1001, which is device 100 of FIG. 1 with the metal layers fully fabricated to implement a functional I-O ring 1041, and logic core 1021. A specific logic function 107 is illustrated as part of the logic core 1021 to indicate a logic portion implementing a predefined function. Note that the logic of function 107 can represent logic that is implemented by a designer using fully custom logic, for example defined by a designer from the diffusion layers up to the metal layers, or the logic of function 107 can represent logic that is defined by a designer using semi-custom logic, for example using semi-custom technologies such as a gate array or a standard cell. FIG. 4 further illustrates the dummy cell associated with location 106 as being coupled to function as a by-pass capacitor between Vdd and GND.

Figure 5:
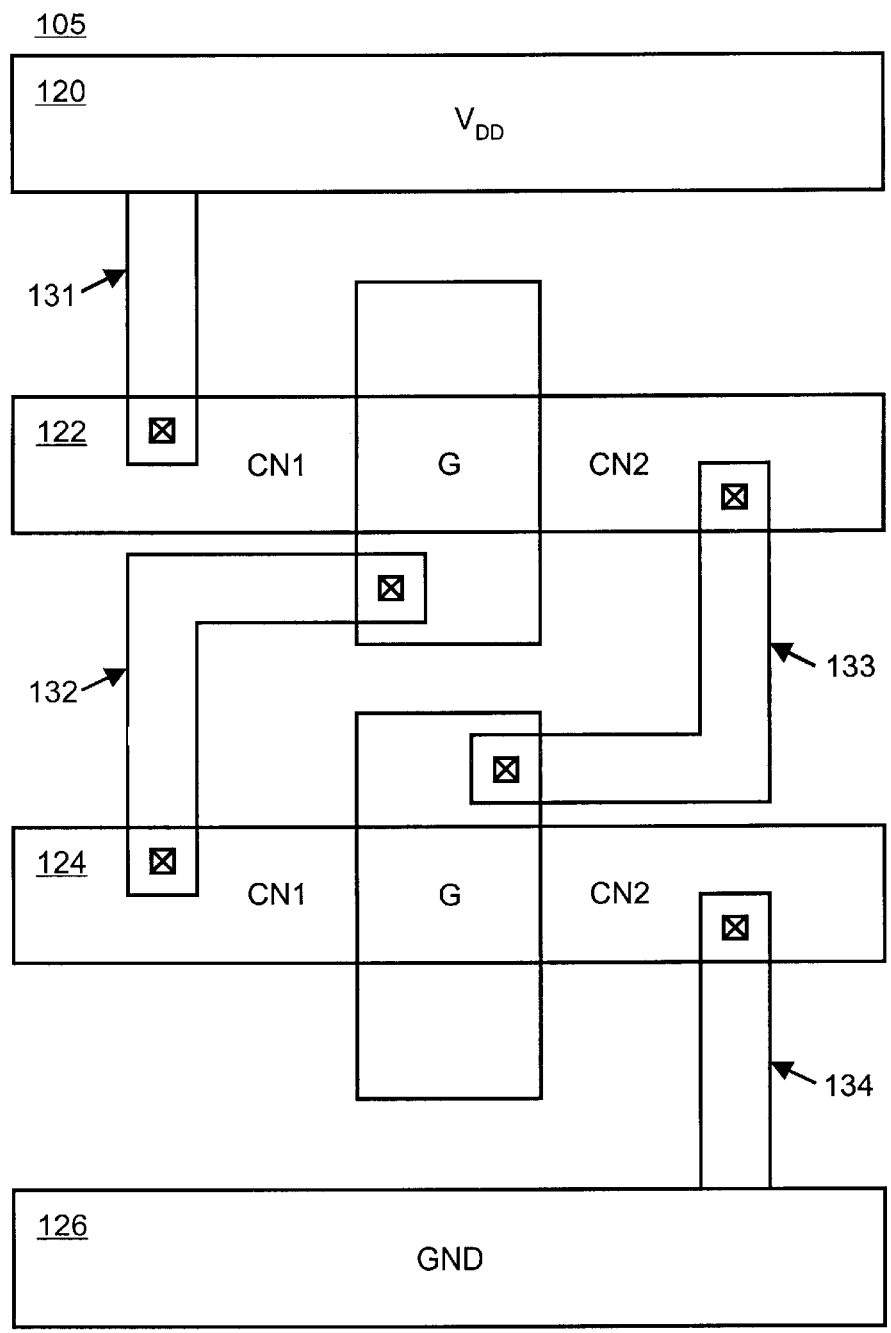
FIG. 5 illustrates a plan view of a dummy cell coupled to form a bypass capacitor 105.
Figure 6:
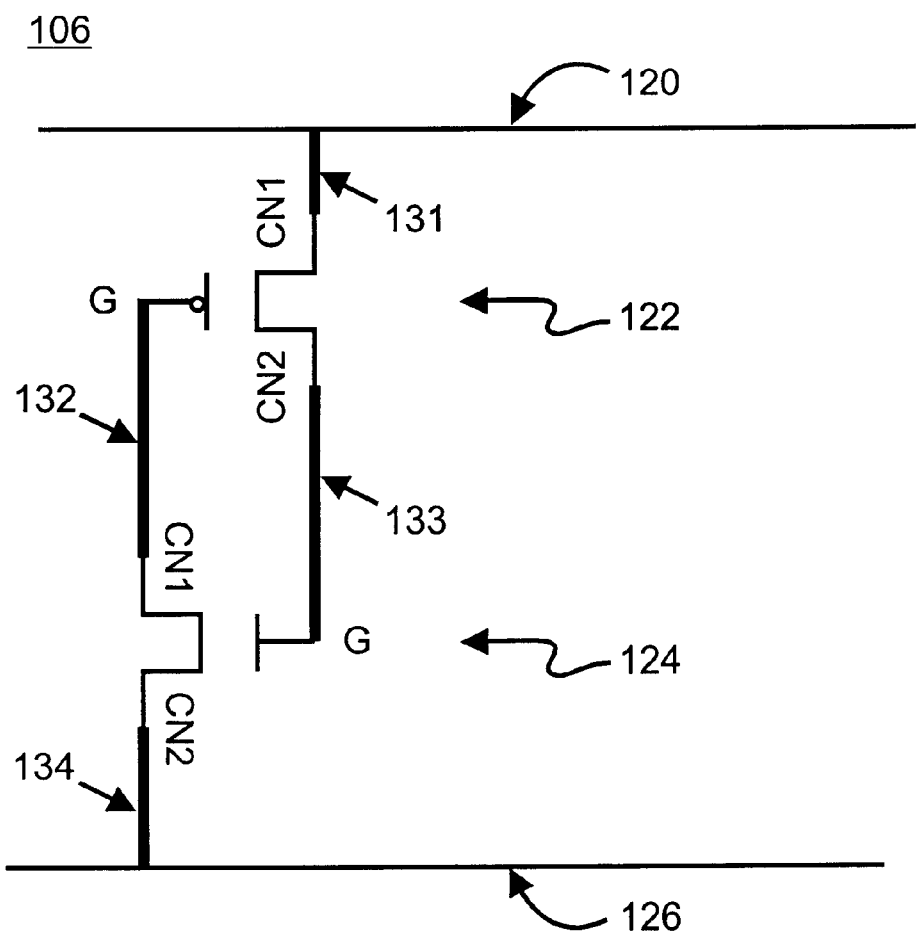
FIG. 6 illustrates a circuit representation of the dummy cell of FIG. 5.

FIG. 5 illustrates a plan view of a dummy cell coupled to form a bypass capacitor using the dummy cell 107. Specifically, a metal trace 131 connects a first current electrode (CN1) of PMOS transistor 122 to Vdd, a metal trace 132 connects the gate of transistor 122 to the first current electrode (CN1) of NMOS transistor 124, a metal trace 133 connects the second current electrode (CN2) of the PMOS transistor 122 to the gate of transistor 124, and a metal trace 134 connects a second current electrode (CN2) of transistor 124 to GND. The resulting circuit functions as a capacitor with the gate dielectrics of transistors 122 and 124 acting as a capacitor dielectric isolating Vdd from GND. FIG. 6 illustrates a circuit representation of the dummy cell 107 implemented as a by-pass capacitor.

Figure 7:
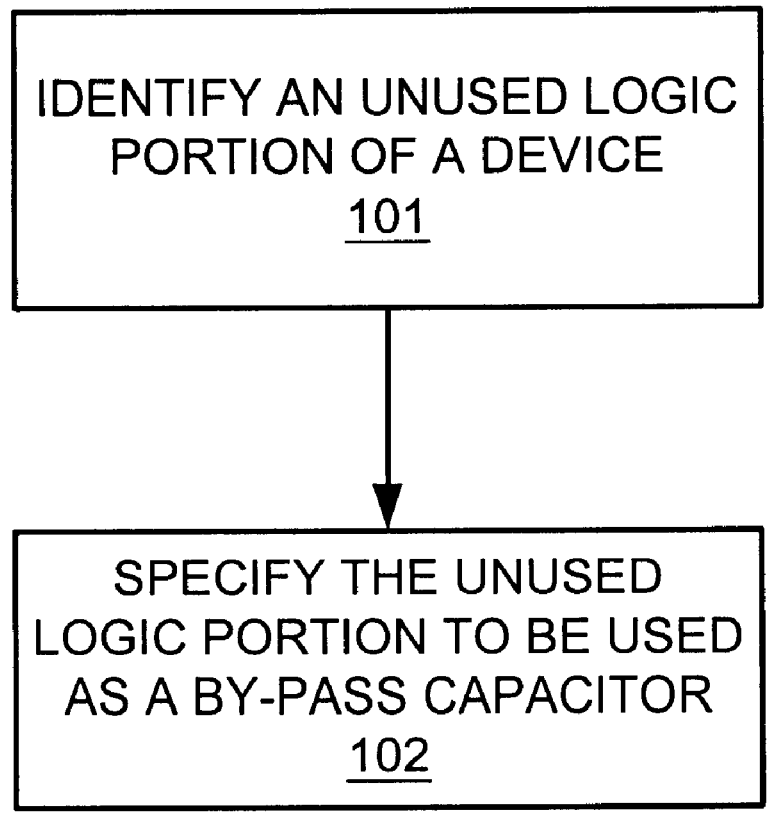
FIG. 7 illustrates, in flow diagram form, a method associated with a specific embodiment of the present disclosure.

FIG. 7 illustrates, in flow diagram form, a method associated with a specific embodiment of the present disclosure. At step 181 an unused logic portion of a device is identified. The unused logic portion is a portion of the device that is not used to implement the predefined user function of the device. In one embodiment, the unused logic portions are dummy cells added to a full or semi-custom design to accommodate possible subsequent functional changes a device. In another embodiment, the unused logic portions are extra transistors of a gate array that are not used during the placement and routing of a user-defined application. In one embodiment all unused logic portions of a device are identified at step 181 to act as bypass capacitors. In other embodiments, not all unused portions need to be used as by-pass capacitors. The unused logic portions can be identified manually by a user, or automatically. For example, either a user, or a system responsible for placing and/or routing a specific device, can provide unused cells with a specific label.

At step 182, the unused logic portion identified is step 181 is further identified to be used as a by-pass capacitor. Generally, identifying an unused logic portion of a base array for a specific use, such as a by-pass capacitor, includes identifying a specific metal layer to connect the logic transistors in a specific manner. For example, the metal traces 131–134 of FIG. 4 can be added to the identified unused logic portion to create a by-pass capacitor. This is an improvement over the prior art, which would tie-off, or otherwise disable unused dummy cells of a device.

Figure 8:
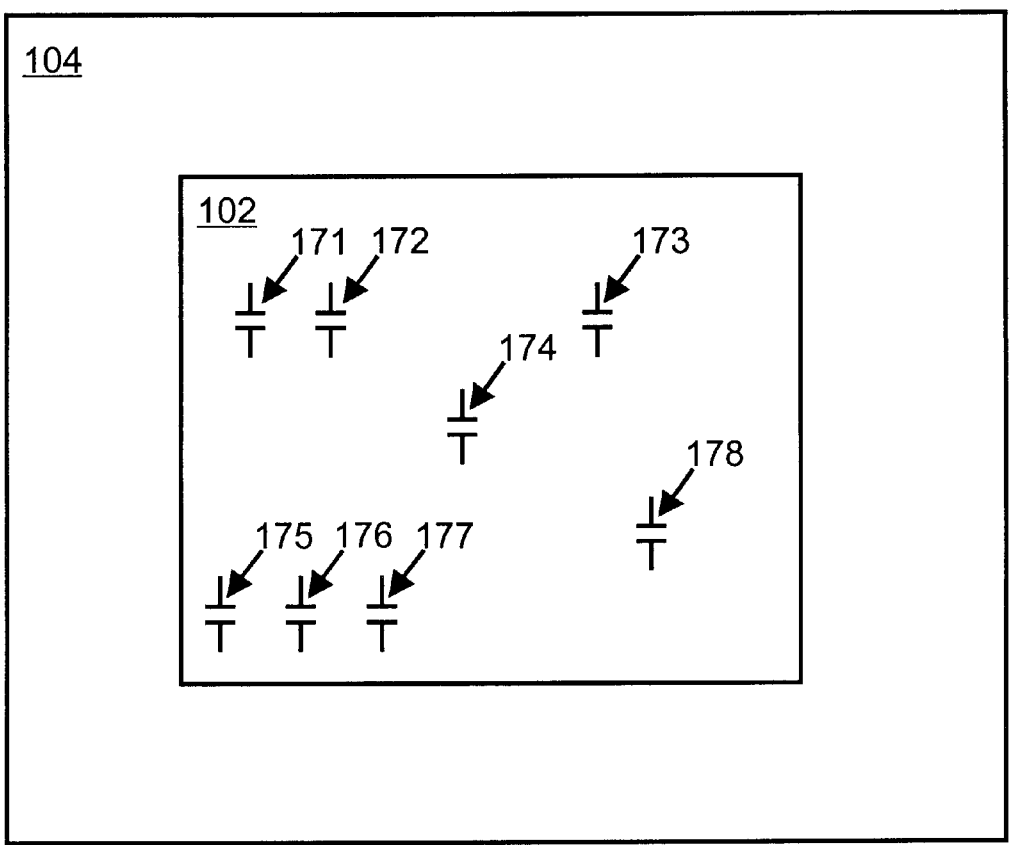
FIG. 8 illustrates a floor plan and circuit view for an integrated circuit device in accordance with the present invention.

FIG. 8 illustrates a specific device 1002 using the base device 100 (FIG. 1). FIG. 8 illustrates device 100 having unused portions 171–178 that have been identified to be, and are implemented as, by-pass capacitors. It will be appreciated that ground bounce can be reduce by implementing unused logic portions as by-pass capacitors. By using the unused logic portions as by-pass capacitors, instead of custom ground bounce cells, device size is minimized, and ground bounce reduced, while maintaining the flexibility to provide additional functionality using some of the unused logic portions if a functional change is needed.

Figure 9:
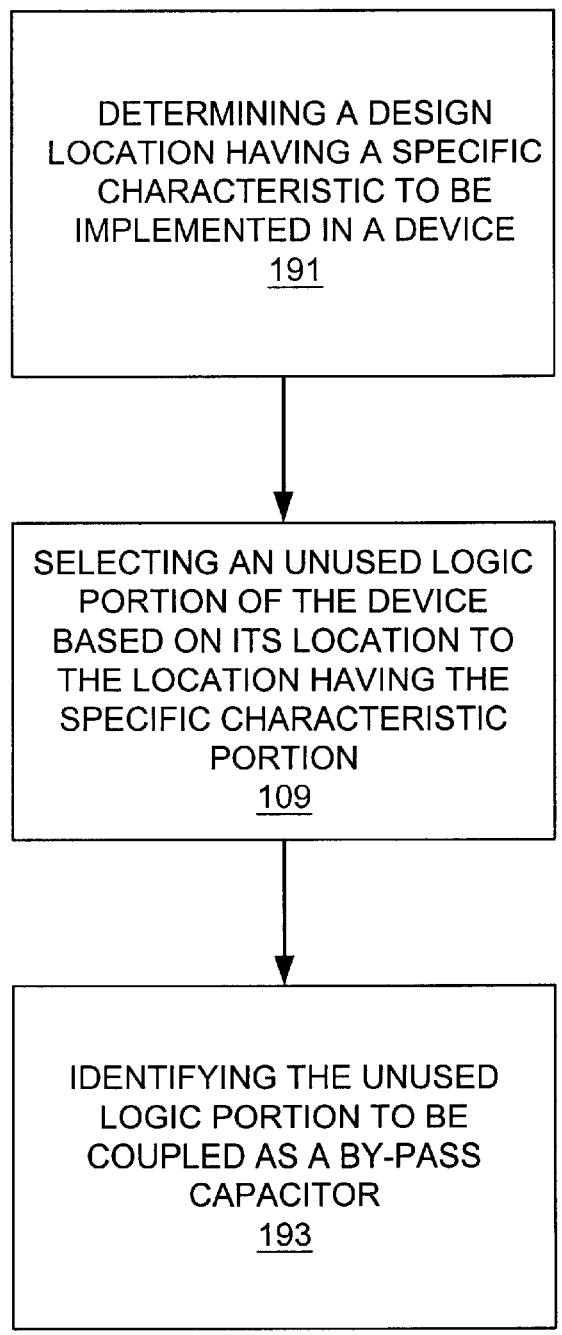
FIG. 9 illustrates, in flow diagram form, a method in accordance with a specific embodiment of the present disclosure.

FIG. 9 illustrates, in flow diagram form, a method in accordance with a specific embodiment of the present disclosure. At step 191, a design location having a specific characteristic to be implemented on a device is determined. For example, the specific characteristic can be a high-speed of operation, relative to other portions of the device, that is expected to contribute to ground bounce if not otherwise compensated. Alternatively, the specific characteristic can be an input and/or output location, or a location having a high-drive characteristic, that may contribute to ground bounce if not otherwise compensated. The design location having the specific characteristic can be determined manually by a user, or automatically using simulations or static design analysis methods.

At step 192, an unused logic portion is selected based on its location relative to the design location having the specific characteristic. One purpose of step 192 is to assure an unused logic portion, if any are available, is maintained near the design location. For example, if only one unused design location was available, step 192 would reserve a dummy cell near the design location.

At step 193, the unused logic portion identified at step 192 is identified as a portion to be coupled as a by-pass capacitor in the manner previously discussed. It will be appreciated that step 193 can be occur before a design is placed by automatic placement software, thereby to assuring a by-pass capacitor is achieved near the design location, or the step 193 can occur after a design is placed, provided the selection of the unused logic portion at step 192 results in the unused logic portion remaining unused until the by-pass capacitor can be placed.

Figure 10:
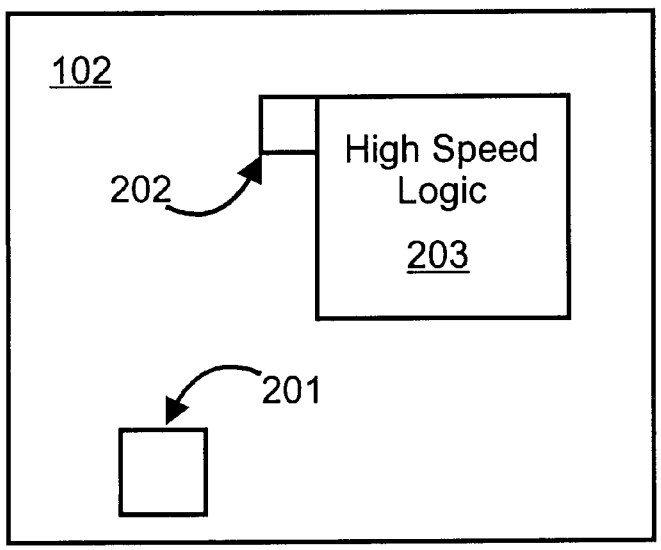
FIG. 10 illustrates a floor plan view for an integrated circuit device having multiple dummy cells.

FIG. 10 illustrates a device 1002 having dummy cells 202 and 201. The dummy cell 202 is closer to high speed logic portion 203, and therefore would be selected, or weighted, over the dummy cell 201 so that dummy cell 201 would be used to implement additional functionality before the dummy cell 202. This helps assure that the dummy cell 202 is used as a by-pass capacitor, instead of logic.

The method of FIG. 9 provides additional advantages over previous methods in that the method allows for unused dummy logic cells in close proximity to a specific location to be available to compensate for expected ground bounce at locations deemed most likely to be affected by ground bounce.

Figure 11:
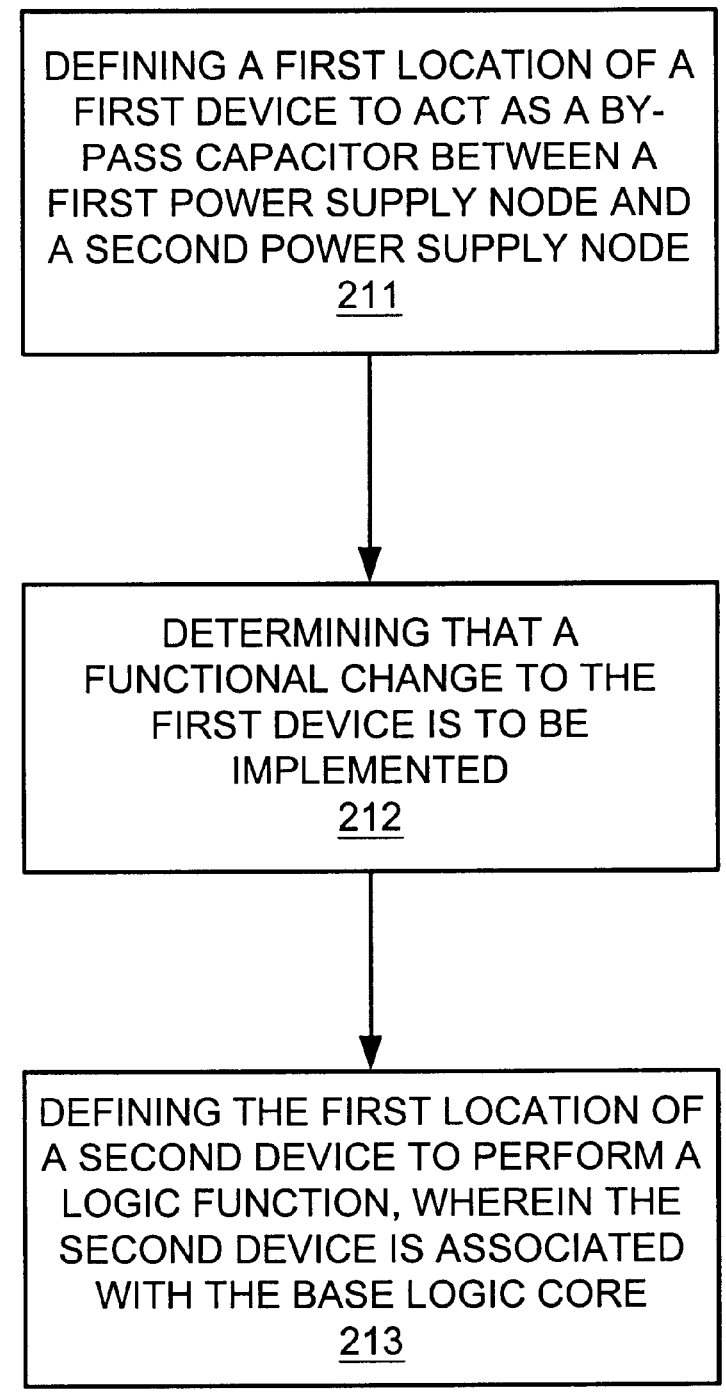
FIG. 11 illustrates a specific method in accordance with the present invention.

FIG. 11 illustrates a specific method in accordance with the present invention. At step 211 a first location of a first device is defined to act as a by-pass capacitor between a first and second power supply node, such as Vdd and GND. The first device represents a first implementation of an application specific device, and is integrated onto a specific base core.

At step 212, a determination is made that a functional change to the first device is needed. For example, it can be determined that a specific feature can be enhanced by using additional logic.

At step 213, the first location on a second device is defined to perform a logic function based on the determination of step 212. The second device represents a second, or modified, implementation of the application specific device, and is integrated onto the base core. For example, the first device can be a first revision of a base design, whereby a specific dummy cell is implemented as a bypass capacitor, while the second device is built using the same base die, but has a different metal layer to implement a logic function using the dummy cell.

Figure 12:
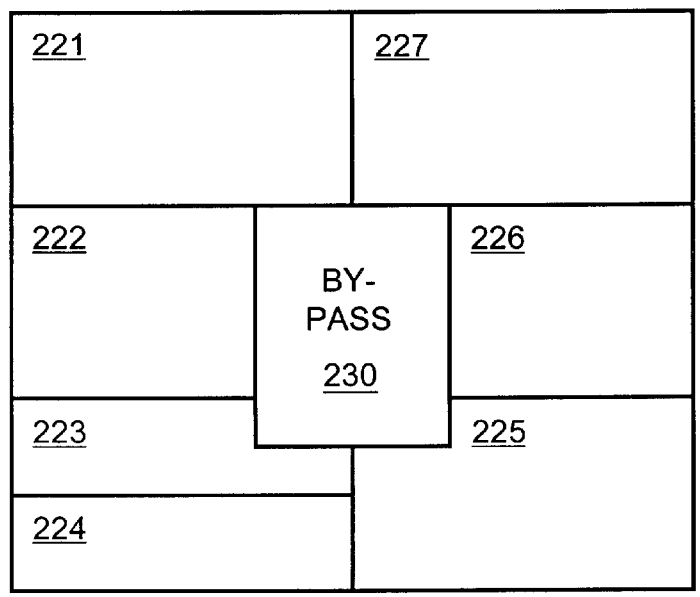
FIG. 12 illustrates an application specific device having multiple functional portions.
Figure 13:
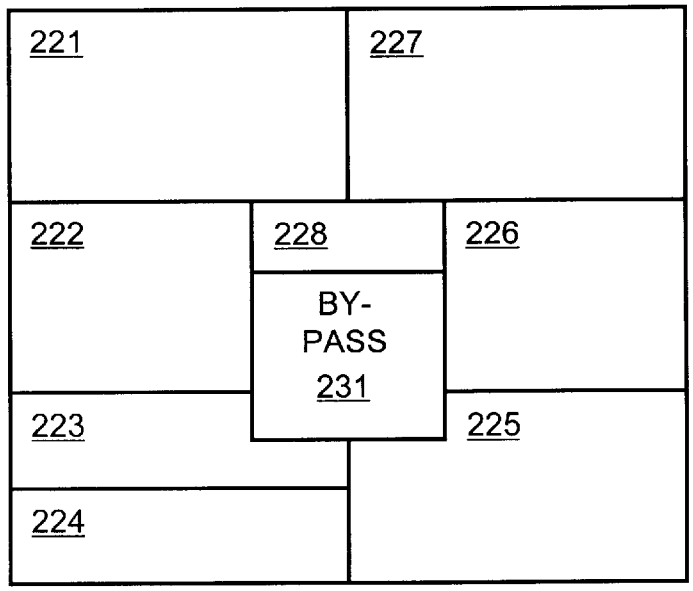
FIG. 13 illustrates the application specific device of FIG. 12 having an additional functional portion.

FIG. 12 illustrates an application specific device 210 having specific functional portions 221–227, and a plurality of dummy gates 230 configured as by-pass capacitors. Note that the block 230 represents the total number of dummy gates, not their actual location on the device 210. In one implementation, the device 210 can represent a graphics device whereby the portions 221–227 can represent one or more of a 2-dimensional graphics engine, a 3-dimensional graphics engine, a memory controller, cache memory, and a display engine. If the initial design is flawless, the dummy cells can remain as by-pass capacitors 230. However, if the initial design needs to be modified, a change in the metal mask(s) of a device using the same base layer can be made to create a additional logic functions 228, thereby reducing the number of dummy cells available for use as by-pass capacitors.

It should be understood that the specific steps indicated in the methods herein, and/or the functions of specific modules herein, may be implemented in hardware and/or software. For example, a specific step or function may be performed using software and/or firmware executed on one or more a processing modules. In general, such a system for implementing by-pass capacitors using logic gates may include a more generic processing module and memory. The processing module can be a single processing device or a plurality of processing devices. Such a processing device may be a microprocessor, microcontroller, digital processor, microcomputer, a portion of a central processing unit, a state machine, logic circuitry, and/or any device that manipulates the signal.

The manipulation of these signals is generally based upon operational instructions represented in a memory. The memory may be a single memory device or a plurality of memory devices. Such a memory device may be a read only memory, a random access memory, a floppy disk memory, magnetic tape memory, erasable memory, a portion of a system memory, and/or any device that stores operational instructions in a digital format. (See FIG. 14) Note that when the processing module implements one or more of its functions, it may do so where the memory storing in the corresponding operational instructions is embedded within the circuitry comprising a state machine and/or other logic circuitry.

Figure 14:
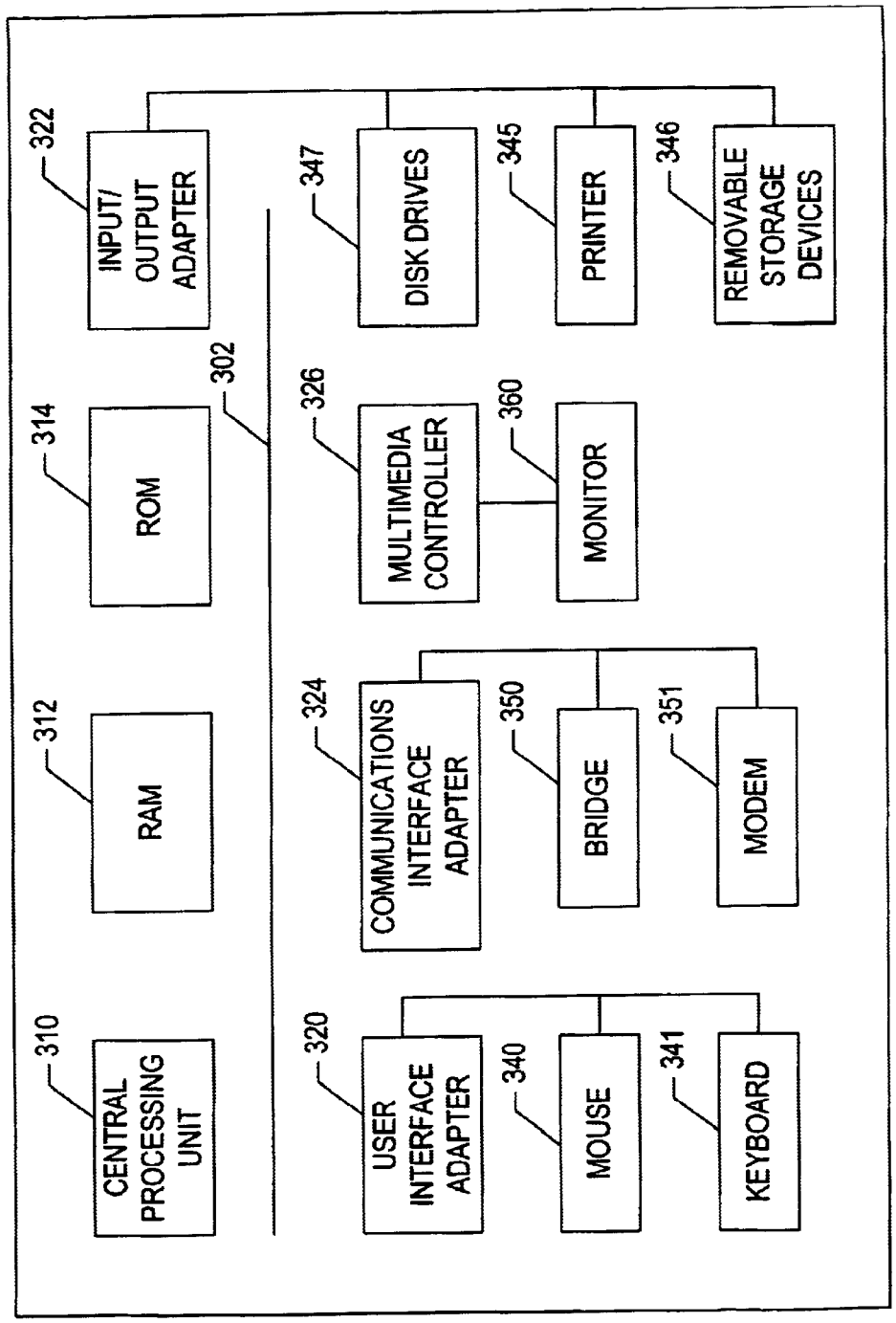
FIG. 14 illustrates, in block diagram form, a processing device in the form of a personal computer system.

FIG. 14 illustrates, in block diagram form, a processing device in the form of a personal computer system 300 which can represent a desk top computer, laptop computer, work station, and/or hand held devices. The computer system 300 is illustrated to include a central processing unit 310, which may be a conventional proprietary data processor, memory including random access memory 312, read only memory 314, and input output adapter 322, a user interface adapter 320, a communications interface adapter 324, and a multimedia controller 326.

The input output (I/O) adapter 326 is further connected to, and controls, disk drives 347, printer 345, removable storage devices 346, as well as other standard and proprietary I/O devices.

The user interface adapter 320 can be considered to be a specialized 1/0 adapter. The adapter 320 is illustrated to be connected to a mouse 340, and a keyboard 341. In addition, the user interface adapter 320 may be connected to other devices capable of providing various types of user control, such as touch screen devices.

The communications interface adapter 324 is connected to a bridge 350 such as is associated with a local or a wide area network, and a modem 351. By connecting the system bus 302 to various communication devices, external access to information can be obtained.

The multimedia controller 326 will generally include a video graphics controller capable of displaying images upon the monitor 360, as well as providing audio to external components (not illustrated).

Generally, the system 300 will be capable of implementing the system and methods described herein. For example, the system 300 can be used to implement an application specific design, whereby the system 300 can determine which dummy cells of a design are to used as by-pass capacitors.

In the foregoing specification, the invention has been described with reference to specific embodiments. However, one of ordinary skill in the art will appreciate that various modifications and changes can be made without departing from the scope of the present invention as set forth in the claims below. Accordingly, the specification and figures are to be regarded in an illustrative rather than a restrictive sense, and all such modifications are intended to be included within the scope of present invention. For example, while the figures herein illustrate cells comprising CMOS gates, other transistor gates are anticipated by the disclosure herein. In addition, the dummy cells herein have been illustrated as having two transistors, cells having varying numbers of transistors are also contemplated.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims.

What is claimed is:

1. A method for implementing by-pass capacitors comprising the steps of:

identifying an unused logic portion of a device, the unused logic portion being part of a metal definable logic portion of the device; and specifying the unused logic portion to be used as a by-pass capacitor between a power node and ground node by coupling a gate electrode of a first transistor to a current electrode of a second transistor.

2. The method of claim 1, wherein the unused logic portion is part of a logic core portion of the device.

3. The method of claim 1, further comprising the step of:

determining, prior to the step of identifying, a location of the device to have a specific characteristic; and wherein the step of identifying includes identifying the unused logic portion of the device based on its proximity to the location.

4. The method of claim 3, wherein the step of determining includes the specific characteristic being a high-speed characteristic.

5. The method of claim 3, wherein the step of determining includes determining the location having the specific characteristic based on a user input.

6. The method of claim 3, wherein the step of determining includes determining the location having the specific characteristic based on a simulation.

7. The method of claim 3, wherein the step of identifying the unused logic portion instead of another unused logic portion includes the unused logic portion being in closer proximity to the location than the another unused logic portion.

8. The method of claim 3, wherein the step of identifying the unused logic portion instead of another unused logic portion includes the unused logic portion being in further proximity to the location than the another unused logic portion.

9. The method of claim 1, wherein the step of identifying includes:
    identifying an unused logic portion of the device, based on the logic portion's location relative to an input-output port of the device.

10. The method of claim 1, wherein the step of identifying an unused logic portion of a device includes identifying an unused logic portion of a graphics device.

11. The method of claim 1, wherein the step of specifying includes indicating a metal portion to couple the unused logic portion to act as a by-pass capacitor.

12. The method of claim 1 wherein specifying the unused logic portion to be used as a by-pass capacitor further comprises:
    coupling a current electrode of the first transistor to the power node; and
    coupling another current electrode of the second transistor to the ground node.

13. A method for implementing by-pass capacitors comprising the steps of:
    defining a first location of a first device to act as a by-pass capacitor between a first power supply node and a second power supply node, wherein the first device is to use a base logic core and the first location is a first logic cell location of the base logic core, wherein the defining the first location of the first device to act as a by-pass capacitor comprises coupling a gate electrode of a first transistor to a current electrode of a second transistor; and
    defining the first location of a second device to perform a logic function, wherein the second device is to use the base logic core.

14. The method of claim 13 wherein defining the first location of a first device to act as a by-pass capacitor further comprises:
    coupling a current electrode of the first transistor to the power node; and
    coupling another current electrode of the second transistor to the ground node.

15. A method for implementing by-pass capacitors comprising the steps of:
    defining a first location of a first device to act as a by-pass capacitor between a first power supply node and a second power supply node, wherein the first device is to be fabricated using a base logic core and the first location is a first logic cell location of the base logic core, wherein the defining the first location of the first device to act as a by-pass capacitor comprises coupling gate electrode of a first transistor to a current electrode of a second transistor;

determining that a functional change to the first device is to be implemented; and
defining a new metal mask layer, wherein the new metal mask layer is to result in the first location of a second device to perform a logic function implementing the functional change, wherein the second device is to be fabricated using the base logic core.

16. A device for implementing by-pass capacitors comprising:
    a logic core having a first metal modifiable logic portion and a second modifiable logic portion;
    a first metal layer coupled to the first metal modifiable logic portion to implement a logic gate; and
    a second metal layer coupled to the second metal modifiable logic portion to implement a by-pass capacitor between a first voltage reference node and a second voltage reference node; wherein the first metal modifiable logic portion includes:
        a first transistor having a first signal node coupled to the first voltage reference node, a second signal node, and a control node, and
        a second transistor having a first signal node coupled to the control node of the first transistor, a second signal node coupled to the second voltage reference node, and a control node coupled to the second signal node of the first transistor.

17. A system for designing integrated circuit devices, the system comprising:
    a processing module; and
    memory operably coupled to the processing module, wherein the memory stores operational instructions that cause the processing module to:
        identify an unused logic portion of a device, the unused logic portion being part of a metal definable logic portion of the device; and
        specify the unused logic portion to be used as a by-pass capacitor between a power node and ground node by coupling a gate electrode of a first transistor to a current electrode of a second transistor.

18. A computer readable medium (storage medium) for storing instructions for use in the design of integrated circuits, the instructions for implementing the steps of:
    identifying an unused logic portion of a device, the unused logic portion being part of a metal definable logic portion of the device; and
    specifying the unused logic portion to be used as a by-pass capacitor between a power node and ground node by coupling a gate electrode of a first transistor to a current electrode of a second transistor.

* * * * *

UNITED STATES PATENT AND TRADEMARK OFFICE
CERTIFICATE OF CORRECTION

| | | |
|---|---|---|
| PATENT NO. | : 6,691,294 B2 | Page 1 of 1 |
| APPLICATION NO. | : 10/055835 | |
| DATED | : February 10, 2004 | |
| INVENTOR(S) | : Ming Kin Law | |

It is certified that error appears in the above-identified patent and that said Letters Patent is hereby corrected as shown below:

In the Claims

Column 8, line 11, claim 16, change "a second modifiable" to be --a second metal modifiable--

Column 8, line 17, claim 16, change "node; wherein" to be --node, wherein--

Column 8, beginning at line 17, claim 16, change "the first metal modifiable" to be --the second metal modifiable--

Signed and Sealed this
Twenty-fifth Day of March, 2014

Michelle K. Lee
*Deputy Director of the United States Patent and Trademark Office*